(12) United States Patent
Lin et al.

(10) Patent No.: US 7,659,189 B2
(45) Date of Patent: Feb. 9, 2010

(54) METHOD FOR FORMING FULLY SILICIDED GATE ELECTRODE IN A SEMICONDUCTOR DEVICE

(75) Inventors: Chien-Ting Lin, Hsin-Chu (TW);
Li-Wei Cheng, Hsin-Chu (TW);
Che-Hua Hsu, Hsin-Chu Hsien (TW);
Yao-Tsung Huang, Kaohsiung County (TW); Guang-Hwa Ma, Hsinchu (TW)

(73) Assignee: United Microelectronics Corp., Hsin-Chu (TW)

( * ) Notice: Subject to any disclaimer, the term of this patent is extended or adjusted under 35 U.S.C. 154(b) by 313 days.

(21) Appl. No.: 11/686,961

(22) Filed: Mar. 16, 2007

(65) Prior Publication Data

US 2008/0224239 A1  Sep. 18, 2008

(51) Int. Cl.
*H01L 21/3205* (2006.01)
*H01L 21/4763* (2006.01)
*H01L 21/44* (2006.01)

(52) U.S. Cl. .................. 438/585; 438/682; 438/592; 438/655

(58) Field of Classification Search ............... 438/585, 438/581, 583, 630, 651, 682, 157, 267, 176, 438/195, 283, 592, 649, 655
See application file for complete search history.

(56) References Cited

U.S. PATENT DOCUMENTS

| | | | | |
|---|---|---|---|---|
| 6,562,717 | B1 * | 5/2003 | Woo et al. | 438/674 |
| 7,235,472 | B2 * | 6/2007 | Klee et al. | 438/592 |
| 2005/0282329 | A1 | 12/2005 | Li | |
| 2006/0011996 | A1 * | 1/2006 | Wu et al. | 257/412 |
| 2006/0228885 | A1 * | 10/2006 | Saito | 438/650 |

* cited by examiner

*Primary Examiner*—Chuong A. Luu
(74) *Attorney, Agent, or Firm*—Winston Hsu (57) ABSTRACT

A semiconductor MOS device includes a semiconductor substrate; a gate oxide layer disposed on the semiconductor substrate; a fully silicided gate electrode disposed on the gate oxide layer; a composite thin film interposed between the fully silicided gate electrode and the gate oxide layer; a spacer on sidewall of the fully silicided gate electrode; and a source/drain region implanted into the semiconductor substrate next to the spacer. A method for forming the semiconductor MOS device is disclosed.

12 Claims, 15 Drawing Sheets

METHOD FOR FORMING FULLY SILICIDED GATE ELECTRODE IN A SEMICONDUCTOR DEVICE

BACKGROUND OF THE INVENTION

1. Field of the Invention

The present invention relates generally to semiconductor processing. More specifically, the present invention relates to a method for forming fully silicided gate electrodes in a semiconductor device.

2. Description of the Prior Art

As semiconductor technology advances, semiconductor devices are becoming increasingly smaller. However, this scaling down of devices may cause problems. For example, as gate oxides are scaled down, gate capacitance due to polysilicon depletion issues becomes more problematic, adversely affecting device performance.

One solution to this problem is the use of different metal gates for both NMOS and PMOS field effect transistors to serve as a replacement to polysilicon gates. However, the formation and integration of these dual metal gates are complex tasks as compared to form traditional doped polysilicon gates.

Instead of the formation of dual metal gates, one type of technology known today is to form a fully silicided (FUSI) gate electrode by using radiated heat during a rapid thermal annealing process to fully silicide a silicon layer.

FUSI gate electrode has attracted much attention recently as a promising metal gate candidate and has been studied widely for its simplified integration and tunable work function. However, it is still an issue to achieve real band-edge work function modulation.

SUMMARY OF THE INVENTION

It is one object of the present invention to provide an improved fully silicided (FUSI) process to form fully silicided gate electrodes of a MOS device, which is capable of reducing work function thereof to reach NMOS band edge and also reducing the equivalent oxide thickness (EOT) of the MOS device.

According to the claimed invention, a method for forming a fully silicided gate electrode in a semiconductor device is provided.

A semiconductor substrate having thereon a gate oxide layer is prepared. A polysilicon layer is then deposited on the gate oxide layer. A blanket ion implantation process is carried out to implant dopant species into the polysilicon layer to a first depth. A gate hard mask is formed on the polysilicon layer, wherein the gate hard mask defines gate pattern. The polysilicon layer and the gate oxide layer are etched to form a gate structure composed of the gate oxide layer, the polysilicon layer and the gate hard mask. Spacers are formed on respective sidewalls of the gate structure. Source/drain is formed in the semiconductor substrate next to the spacers and is then activated. A first metal layer is formed overlying the source/drain, the spacers, and the gate hard mask. The first metal layer reacts with the source/drain to form source/drain salicide. The unreacted first metal layer is removed. An interlayer dielectric (ILD) layer is deposited overlying the gate structure and the source/drain salicide. A chemical mechanical polishing is carried out on the ILD layer and the gate hard mask to expose the polysilicon layer. A second metal layer is deposited overlying the remaining ILD layer and the exposed polysilicon layer. The second metal layer reacts with the exposed polysilicon layer to form fully silicided (FUSI) gate electrode and a composite thin film containing the dopant species interposed between the FUSI gate electrode and the gate oxide layer.

From another aspect of this invention, a semiconductor metal-oxide-semiconductor (MOS) device is provided. The semiconductor MOS device includes a semiconductor substrate; a gate oxide layer disposed on the semiconductor substrate; a fully silicided gate electrode disposed on the gate oxide layer; a composite thin film interposed between the fully silicided gate electrode and the gate oxide layer; a spacer on sidewall of the fully silicided gate electrode; and a source/drain region implanted into the semiconductor substrate next to the spacer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

According to one aspect of the present invention, it is proposed to incorporate ytterbium (Yb) implantation (or implantation of other suitable elements) into nickel fully silicided (Ni-FUSI) process in order to reduce NMOS work function such that the work function can reach so-called NMOS band edge.

It is advantageous to use the present invention method because Yb implantation also effectively reduces the equivalent oxide thickness (EOT) of the silicon oxy-nitride (SiON) gate dielectric.

While it has been established, that the vacuum work function can not be realized in a metal/dielectric system, Yb has shown a great potential to reduce the work function of a Ni FUSI gate electrode, which would otherwise be close to mid gap. However, the mechanism of work function reduction by Yb is still not yet clear. It is believed that the work function shift may be caused by Yb pile-up at the interface of NiSi/dielectric during the NiSi formation.

It has been surprisingly found that the implanted Yb not only interacts with the metal electrode and efficiently reduced the work function, but with sufficient thermal budget it also reacts with the gate electrode to reduce the electrical gate oxide thickness. According to this invention, Yb may be replaced with other suitable elements such as Ga, Sc, Y, Lu, Lr, La, Ce, Pr, Nd, Pm, Sm, Eu, Gd, Tb, Dy, Ho, Er, Tm, or Al.

Figure 1:
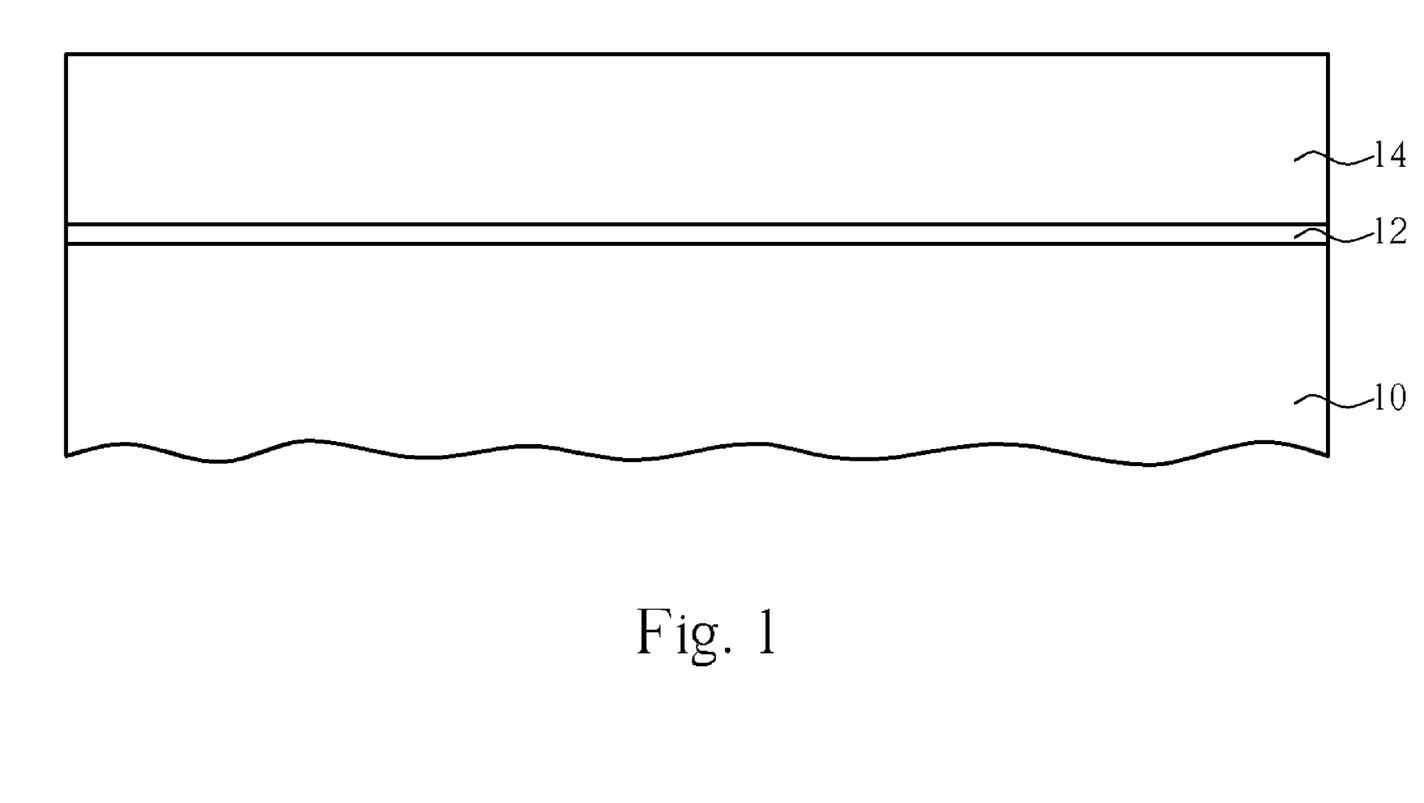
FIGS. 1-7 are schematic, cross-sectional diagrams illustrating the method for forming a nickel fully silicided (Ni-FUSI) gate electrode in a semiconductor device in accordance with one preferred embodiment of this invention.
Figure 2:
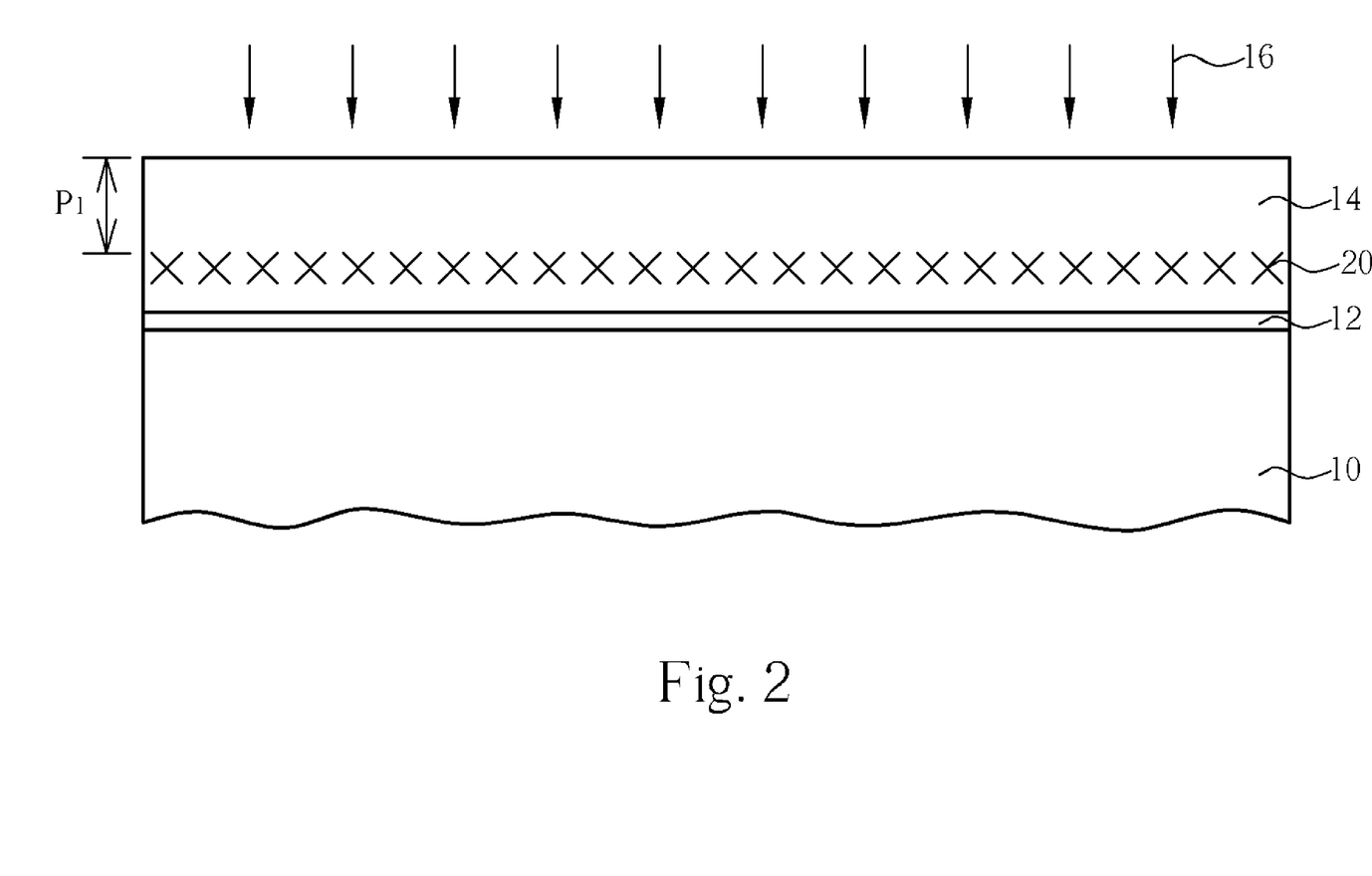
Figure 3:
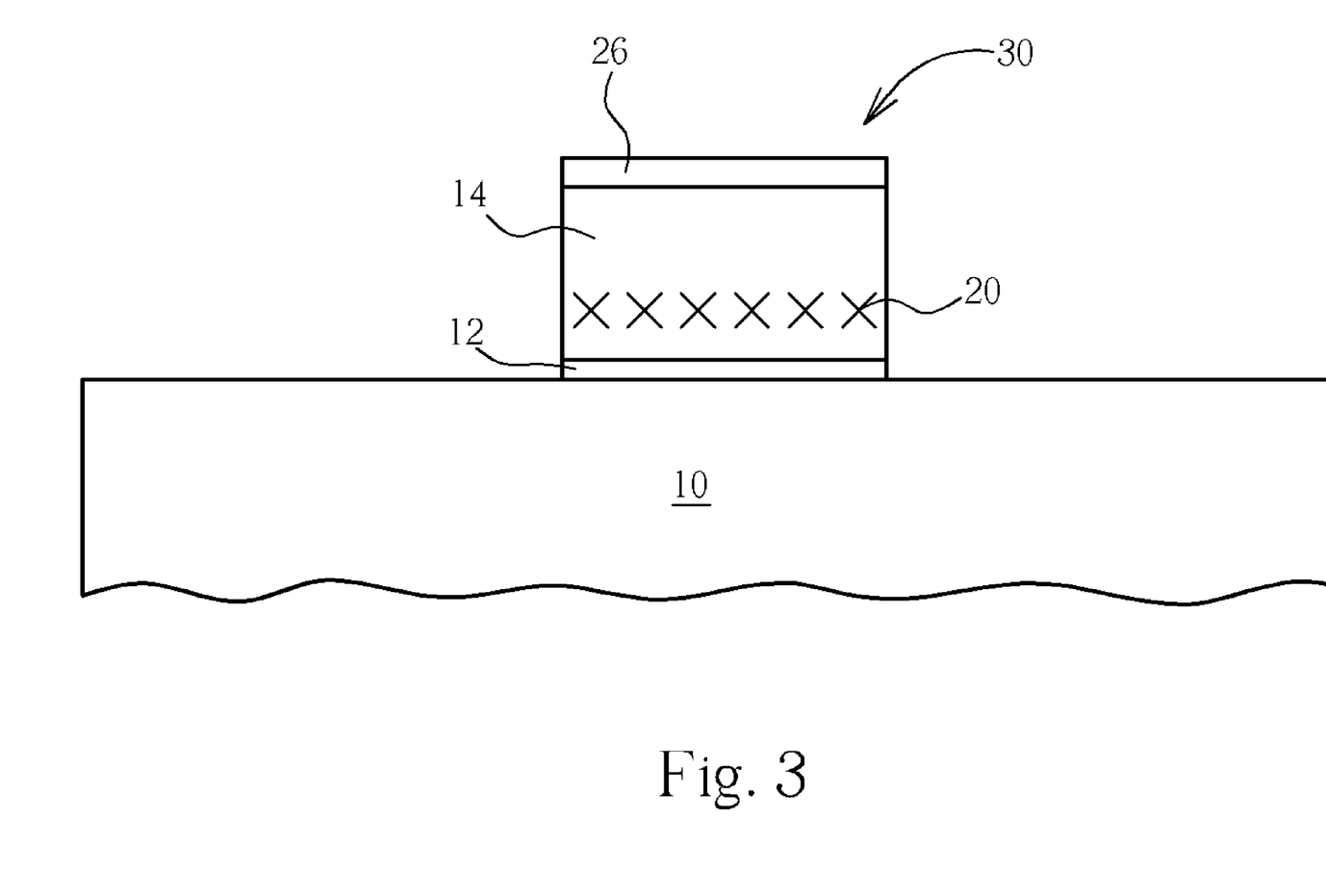
Figure 4:
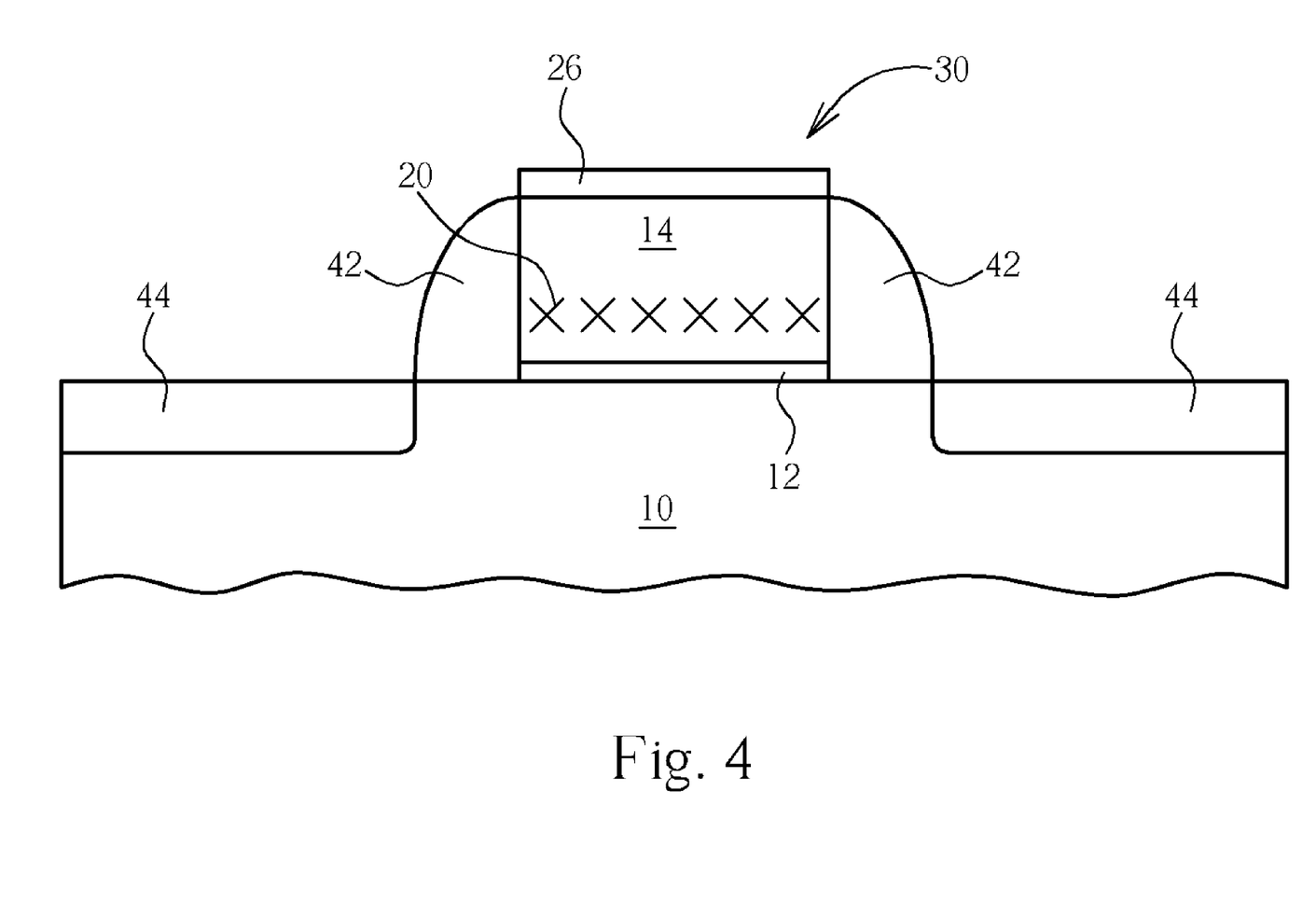
Figure 5:
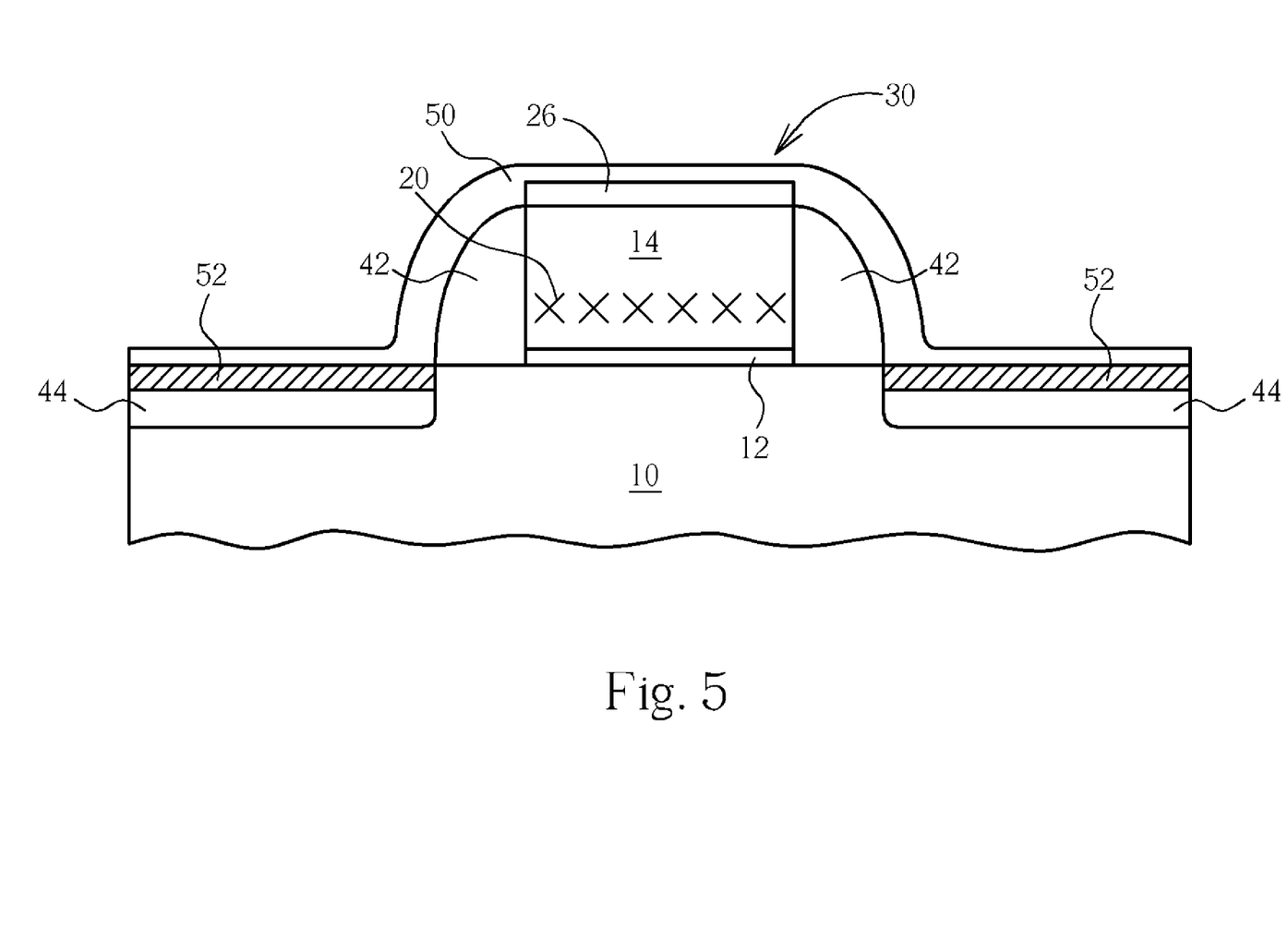
Figure 6:
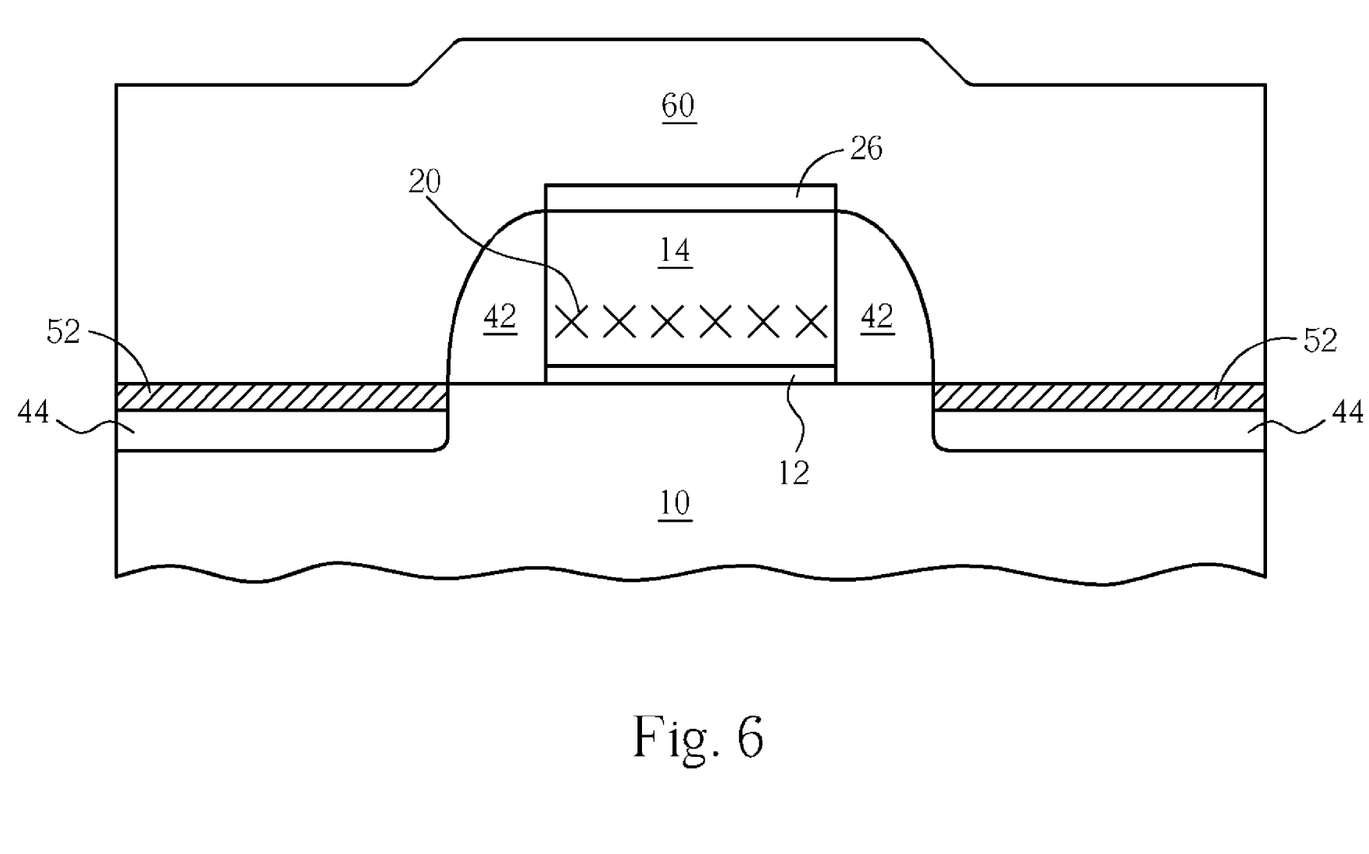
Figure 7:
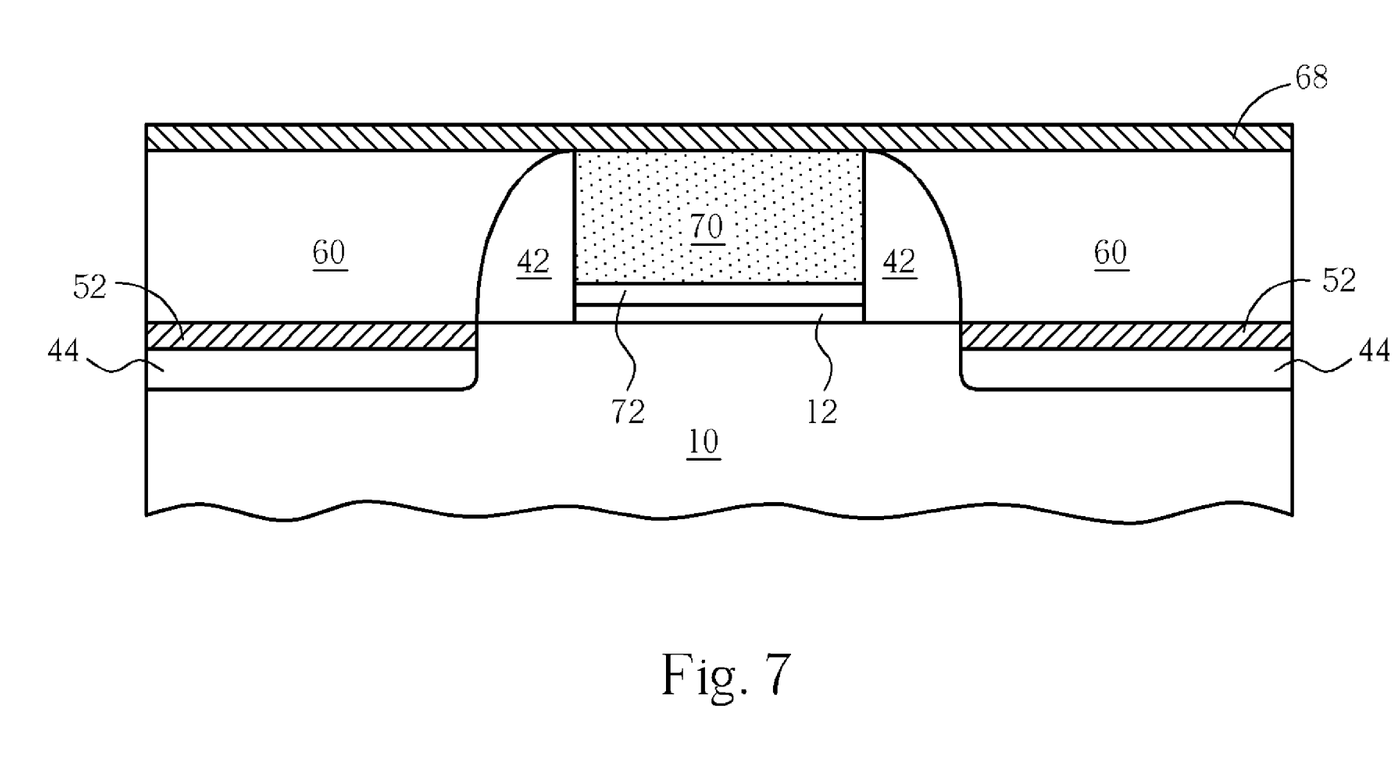

Referring to FIGS. 1-7, according to one preferred embodiment of this invention, the formation of the fully silicided gate electrode of a MOS device includes the steps of:

(1) providing a semiconductor substrate 10 having thereon a gate oxide layer 12 (FIG. 1), wherein the gate oxide layer 12 is preferably SiON and has a preferable thickness of 2.5 nm-3.5 nm;

(2) depositing a polysilicon layer 14 on the gate oxide layer 12 (FIG. 1), wherein the polysilicon layer has preferable thickness of about 50 nm-100 nm, more preferably 80 nm;

(3) performing a blanket ion implantation process 16 to implant Yb 20 (energy: 25-35 KeV) into the polysilicon layer 14 to a first depth p1 (FIG. 2), wherein the preferable dose during the ion implantation process is about 1E14-1E16 atoms/cm$^2$, more preferably 1E15-5E15 atoms/cm$^2$;

(4) forming a gate hard mask 26 such as TEOS oxide mask on the polysilicon layer 14 (FIG. 3), wherein the gate hard mask 26 defines gate pattern;

(5) etching the polysilicon layer 14 and the gate oxide layer 12 to define a gate structure 30 composed of the gate oxide layer 12, the polysilicon layer 14 and the gate hard mask 26 (FIG. 3);

(6) forming spacers 42 on respective sidewalls of the gate structure 30 (FIG. 4);

(7) forming source/drain 44 in the semiconductor substrate 10 next to the spacers 42 (FIG. 4) and activating the source/drain 44 using 1060° C. spike anneal;

(8) depositing a first metal layer 50 overlying the source/drain 44, the spacers 42, and the gate hard mask 26 (FIG. 5), wherein the first metal layer 50 may comprise Ni and Co, but not limited thereto, and then reacting the first metal layer 50 with the source/drain to form source/drain salicide 52 (FIG. 5);

(9) removing the unreacted first metal layer 50 and then depositing an inter-layer dielectric (ILD) layer 60 overlying the gate structure 30 and the source/drain salicide 52 (FIG. 6);

(10) chemical mechanical polishing the ILD layer 60 and the gate hard mask 26 in order to expose the polysilicon layer 14 (FIG. 7); and (11) depositing a second metal layer 68 such as Ni with a thickness of about 50 nm overlying the remaining ILD layer 60 and the exposed polysilicon layer 14, and then reacting the second metal layer 68 with the underlying polysilicon layer 14 to form nickel fully silicided (Ni-FUSI) gate electrode 70 (FIG. 7). The Ni-FUSI gate electrode 70 may comprise NiSi and NiYbSi.

As specifically indicated in FIG. 7, during the silicidation of the polysilicon layer 14, the previously implanted Yb 20 situated at depth p1 is gradually pushed downward to the interface between the polysilicon layer 14 and the gate oxide layer 12, and eventually forming YbSiON thin film 72 interposed between the Ni-FUSI gate electrode 70 and the gate oxide layer 12, which reduces the NiSi work function. The Yb implant can share the same as the N+ poly implant mask. This means no additional mask is needed for this process.

It is believed that Yb reacts with SiON to form the YbSiON thin film 72 with a higher dielectric constant (k) on top of the SiON gate oxide layer. To prevent Yb punch through to the underlying SiON gate oxide layer, the SiON gate oxide layer should not be fully consumed. The present invention band-edge FUSI process is highly compatible with CMOS process.

Figure 8:
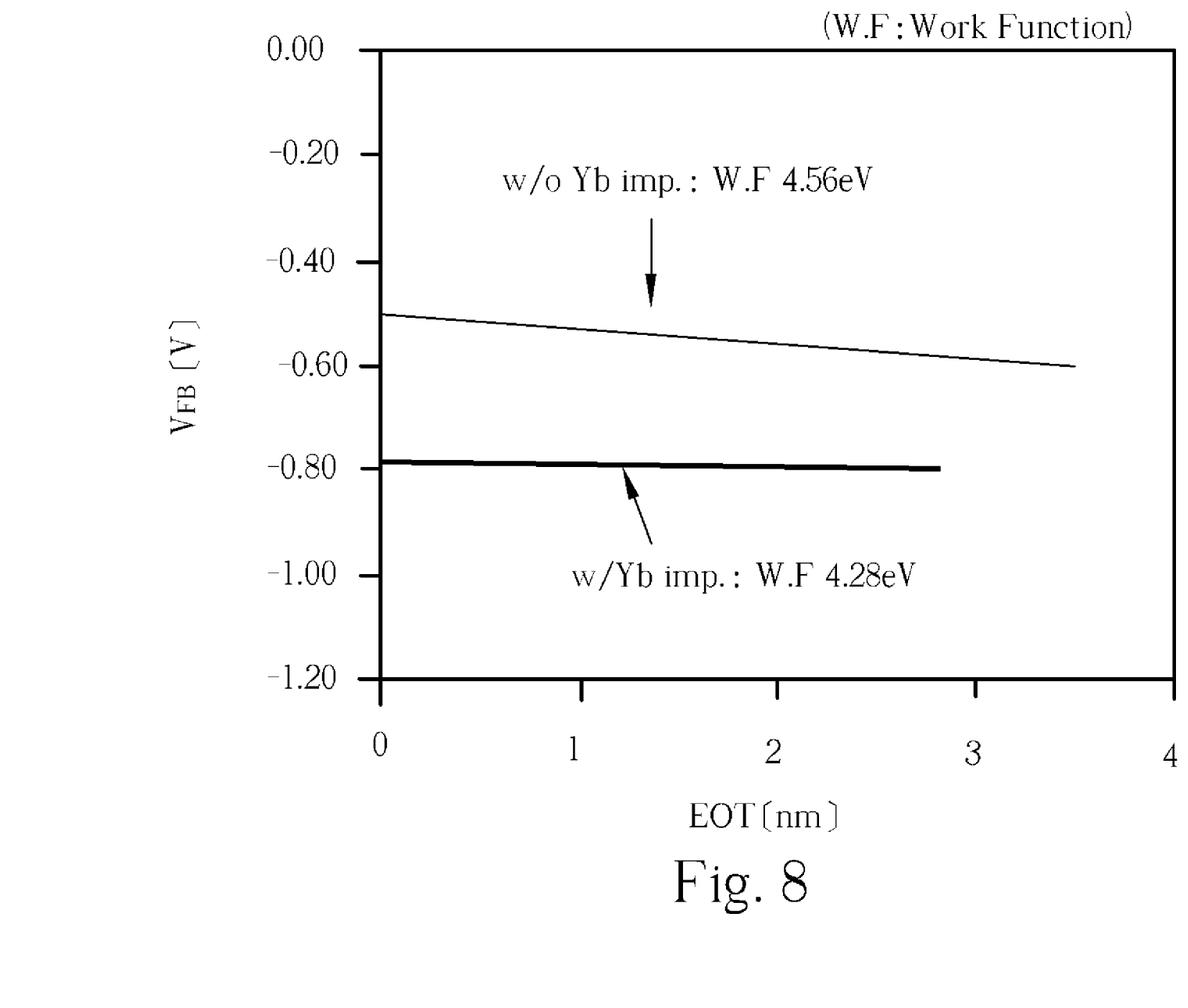
FIG. 8 is a $V_{FB}$-EOT plot ($V_{FB}$: flat-band voltage)
Figure 9:
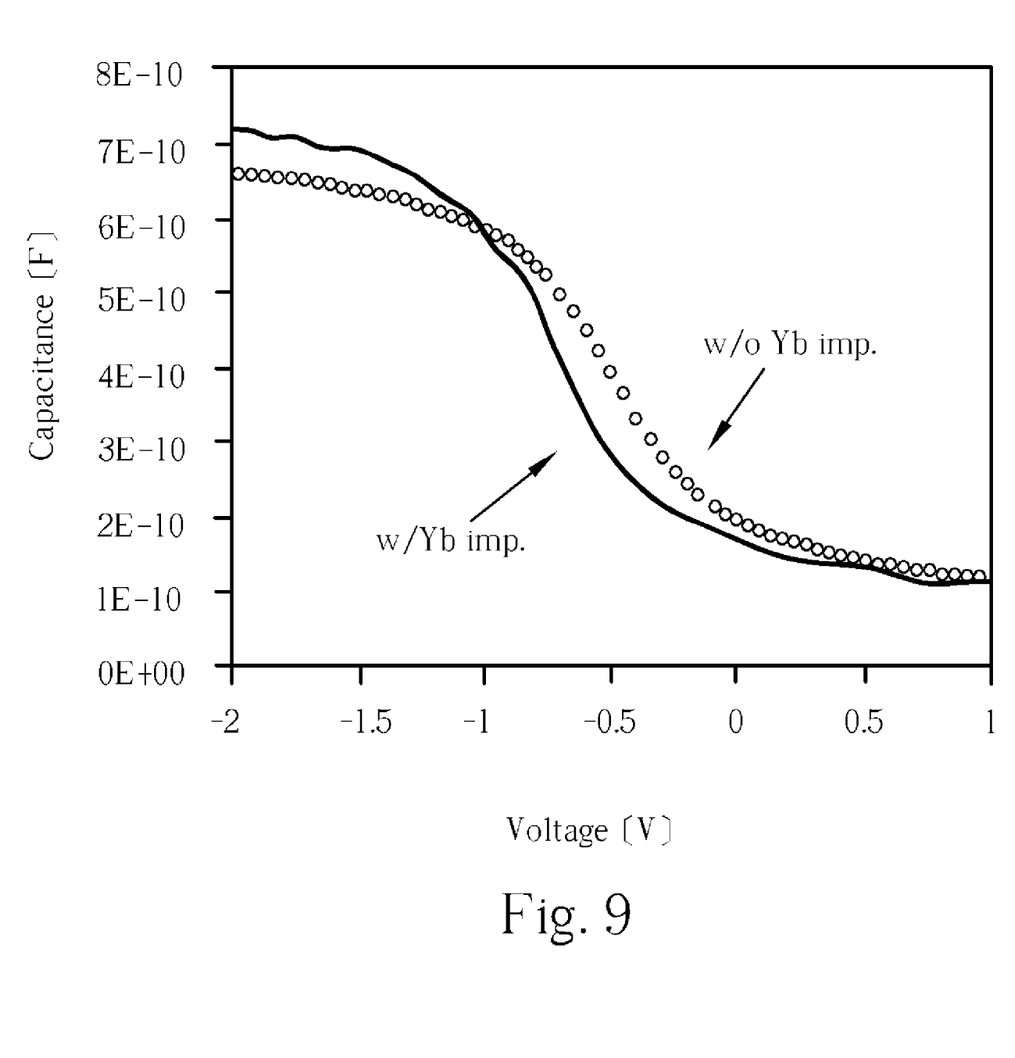
FIG. 9 is CV curve analyzed using Hauser model.

FIG. 8 is a $V_{FB}$-EOT plot ($V_{FB}$: flat-band voltage). As shown in FIG. 8, with Yb implant (dose: 2E15 atoms/cm$^2$), 280 mV NMOS work function reduction can be achieved on SiON gate oxide. EOT reduction is shown in FIG. 9, which is CV curve analyzed using Hauser model. As shown in FIG. 9, Yb implant (dose: 2E15 atoms/cm$^2$) with 2.3 nm EOT, not only obviously shifting $V_{FB}$ but also effectively reducing the EOT by 0.3 nm.

Figure 10:
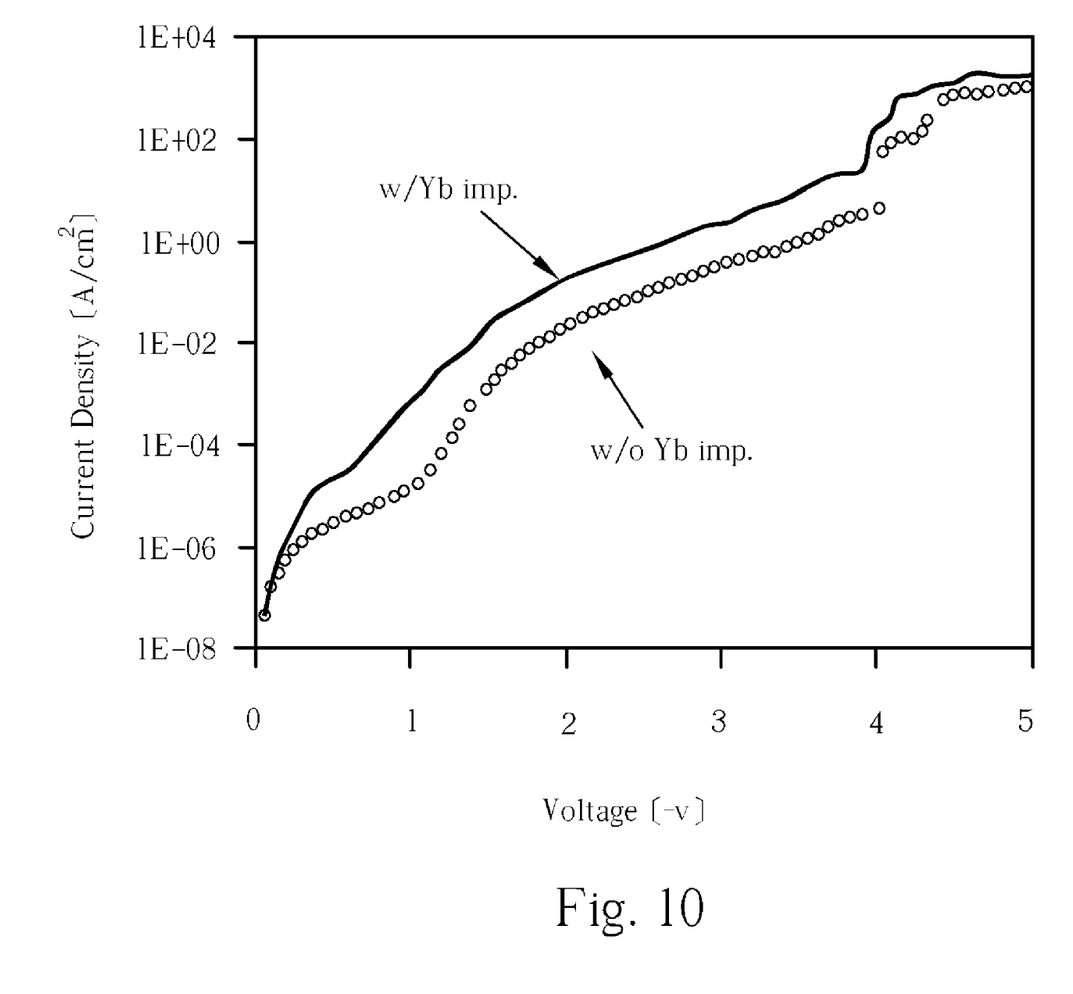
FIG. 10 is current density vs. voltage ploy showing 0.3 nm EOT reduction merely results in one order of magnitude gate oxide leakage increase.
Figure 11:
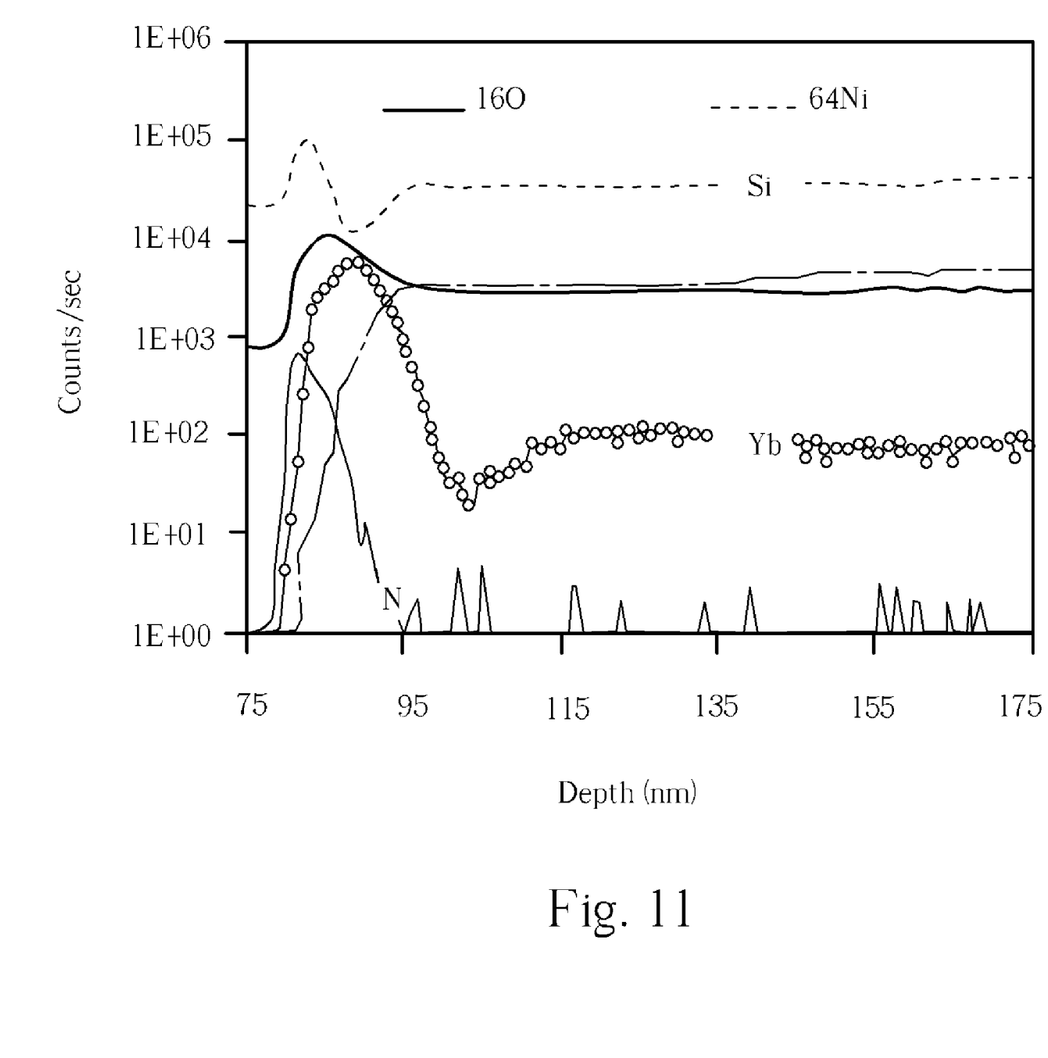
FIG. 11 is SIMS data showing that Yb signal has passed the Ni signal and reached the gate oxide region.

As shown in FIG. 10, the 0.3 nm EOT reduction merely results in one order of magnitude gate oxide leakage increase. Since the leakage increase amount is less than expected from the SiON gate oxide thickness dependence (~1 order of magnitude gate oxide leakage increase by 0.2 nm EOT reduction), it is believed that the top of the SiON has been converted to YbSiON, with higher dielectric constant k, which reduces the work function and EOT concurrently. This mechanism is further confirmed by SIMS data shown in FIG. 11. SIMS data shows that Yb signal has passed the Ni signal and reached the gate oxide region, which is also confirmed by the Si, O and N signals.

Figure 12:
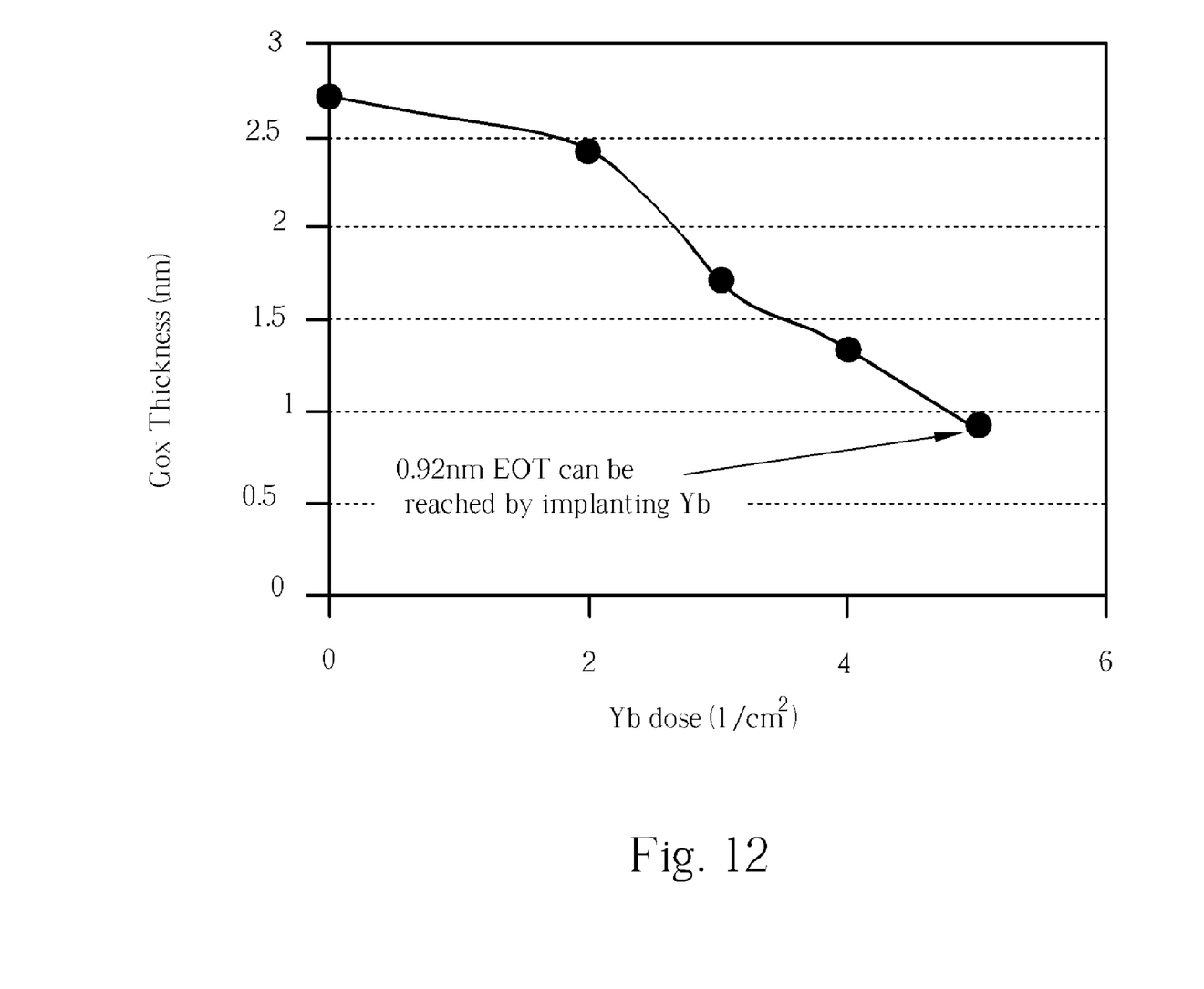
FIG. 12 shows that the EOT decreases further as the implant dose of the Yb increases.
Figure 13:
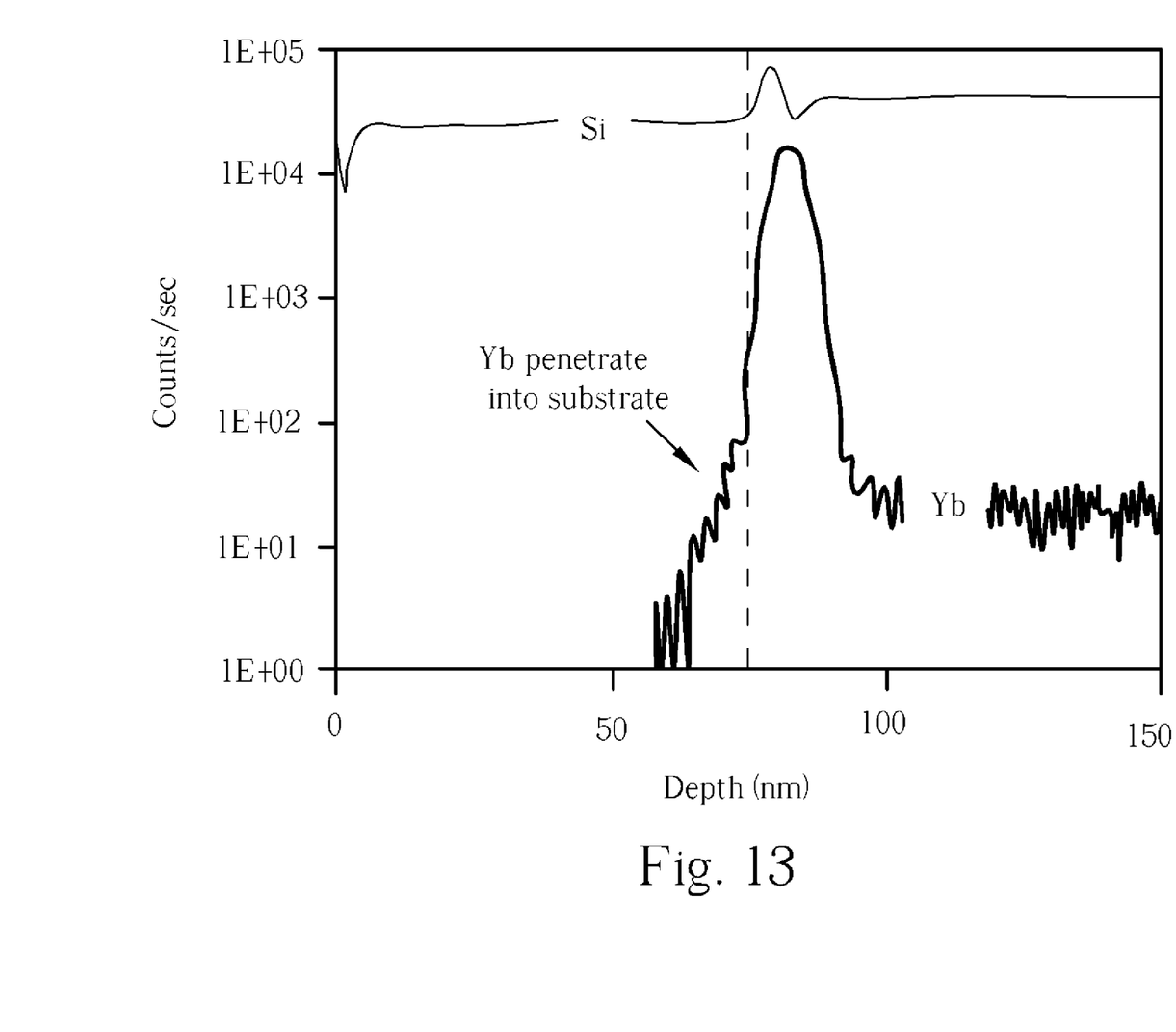
FIG. 13 is SIMS data showing that Yb can reach the Si interface and enter the substrate.

FIG. 12 shows that the EOT decreases further as the implant dose of the Yb increases. At an Yb implant dose of 5E15 atoms/cm2, into 80 nm poly on 2.7 nm SiON, the EOT can reach as thin as 0.92 nm. However, there may be no SiON left as interface layer in such case, and thus Yb can reach the Si interface and enter the substrate. This is evidenced by the SIMS results shown in FIG. 13. If this happens, the gate oxide leakage ($J_g$) and $Q_f$ (fixed charge) rise sharply.

Figure 14:
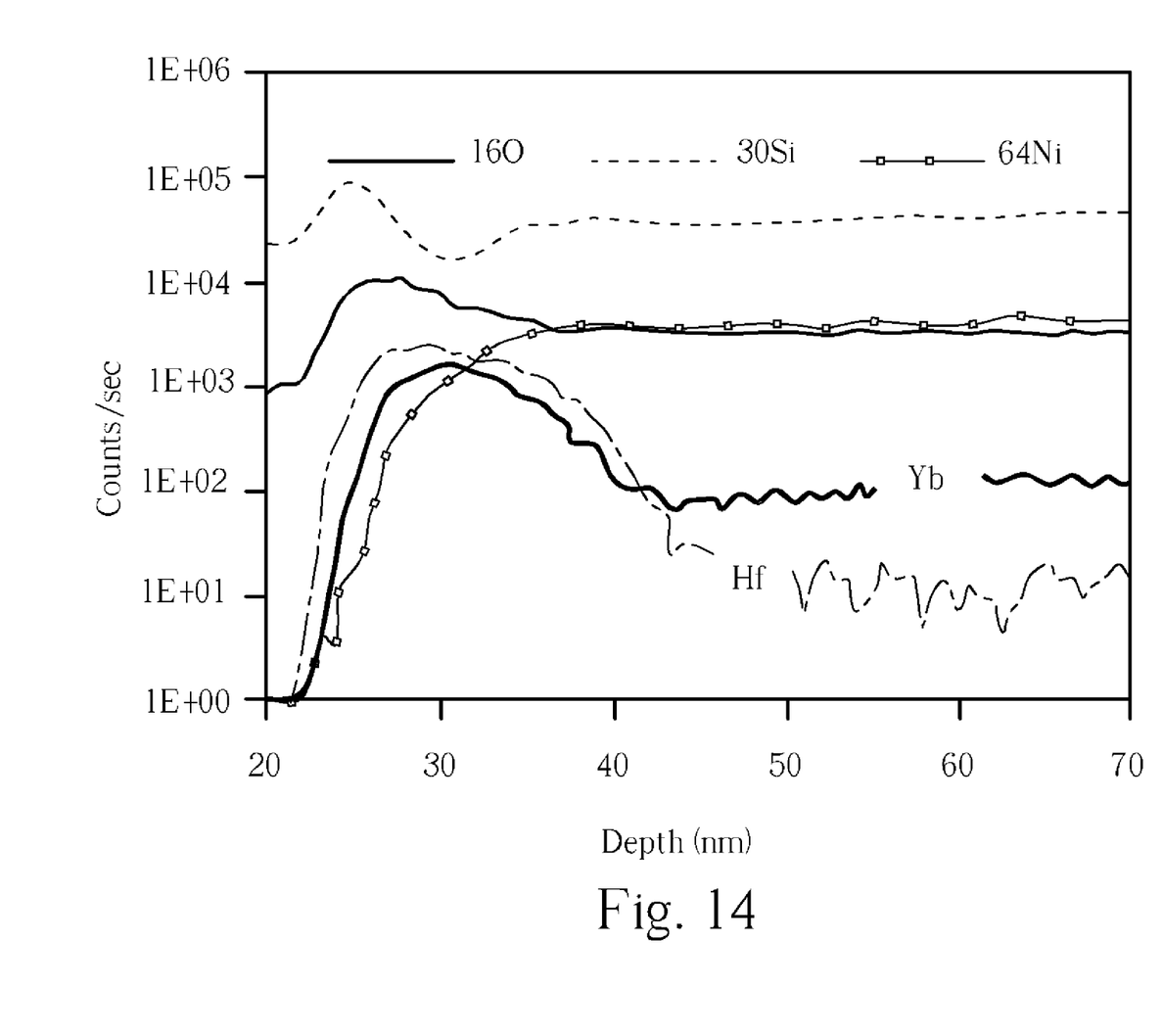
FIG. 14 is SIMS showing the interaction of Yb with the high-k gate oxide over Ni signal.
Figure 15:
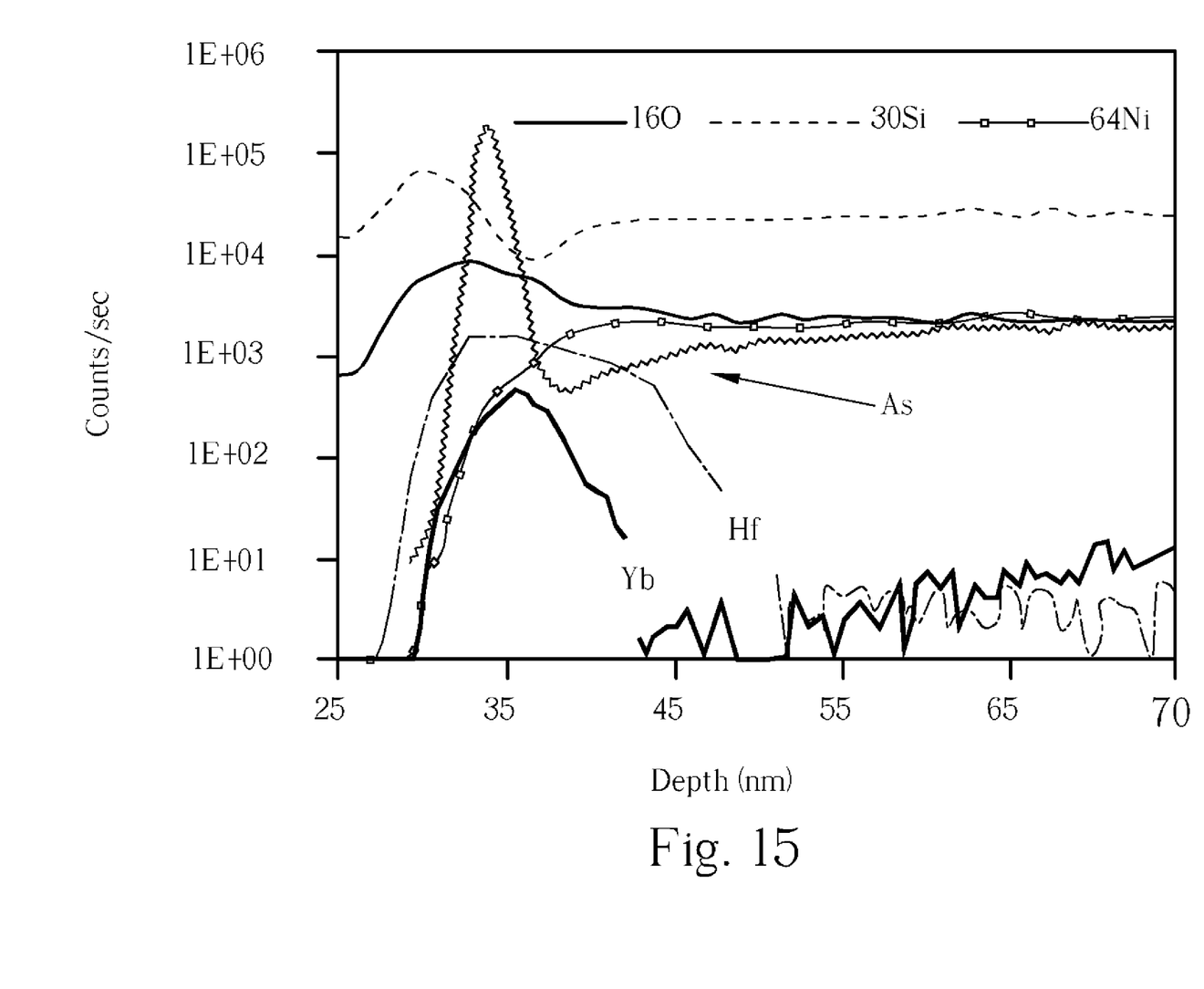
FIG. 15 depicts SIMS data that reveals the As pile-up at FUSI/gate oxide interface and the retarded Yb diffusion.

When implanting Yb into high-k gate oxide such as HfSiON, the EOT reduction is lowered. The 4.2 eV NMOS band-edge work function can be achieved by Yb implant process. FIG. 14 is SIMS showing the interaction of Yb with the high-k gate oxide over Ni signal. However, the NMOS work function will increase 100 mV when arsenic (As) is co-implanted into the poly. FIG. 15 depicts SIMS data that reveals the As pile-up at FUSI/gate oxide interface and the retarded Yb diffusion. Yb signal is significantly reduced and redistributed in the Ni-FUSI.

To sum up, it is found that incorporating Yb implantation into the poly of a Ni-FUSI process can not only reduce the work function to reach NMOS band-edge but, it also can reduce the EOT of SiON gate oxide effectively. It is believed that Yb reacts with SiON to form high-k YbSiON or $Yb_2O_3$ on top of SiON gate oxide. This mechanism is confirmed by gate oxide leakage ($J_g$) and SIMS data. It is experimentally found that increasing Yb implant dose can further reduce the EOT. An EOT of as thin as 0.92 nm can be reached by implanting a dose of 5E15 atoms/cm2 Yb into 80 nm poly on 2.7 nm SiON.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a fully silicided gate electrode in a semiconductor device, comprising:

providing a semiconductor substrate having thereon a gate oxide layer;

depositing a polysilicon layer on the gate oxide layer;

performing a blanket ion implantation process to implant dopant species into the polysilicon layer to a first depth;

forming a gate hard mask on the polysilicon layer, wherein the gate hard mask defines gate pattern;

etching the polysilicon layer and the gate oxide layer to form a gate structure composed of the gate oxide layer, the polysilicon layer and the gate hard mask;

forming spacers on respective sidewalls of the gate structure;

forming source/drain in the semiconductor substrate next to the spacers and activating the source/drain;

depositing a first metal layer overlying the source/drain, the spacers, and the gate hard mask;

reacting the first metal layer with the source/drain to form source/drain salicide;

removing the unreacted first metal layer;

depositing an inter-layer dielectric (ILD) layer overlying the gate structure and the source/drain salicide;

chemical mechanical polishing the ILD layer and the gate hard mask to expose the polysilicon layer; and depositing a second metal layer overlying the remaining ILD layer and the exposed polysilicon layer; and reacting the second metal layer with the exposed polysilicon layer to form fully silicided (FUSI) gate electrode and a composite thin film containing the dopant species interposed between the FUSI gate electrode and the gate oxide layer.

2. The method of claim 1 wherein the gate oxide layer comprises SiON and has a thickness of 2.5 nm-3.5 nm.

3. The method of claim 1 wherein the polysilicon layer has a thickness of about 50 nm-100 nm.

4. The method of claim 1 wherein the dopant species comprises Yb.

5. The method of claim 1 wherein the dopant species is selected from a group consisting of Yb, Ga, Sc, Y, Lu, Lr, La, Ce, Pr, Nd, Pm, Sm, Eu, Gd, Tb, Dy, Ho, Er, Tm, and Al.

6. The method of claim 1 wherein the dose during the blanket ion implantation process of the dopant species is about 1E14-1E16 atoms/$cm^2$, and an implant energy between 25-35 KeV.

7. The method of claim 1 wherein the gate hard mask comprises TEOS oxide.

8. The method of claim 1 wherein the first metal layer comprises Ni and Co.

9. The method of claim 1 wherein the second metal layer comprises Ni.

10. The method of claim 1 wherein the second metal layer has a thickness of about 50 nm.

11. The method of claim 1 wherein the FUSI gate electrode comprises NiSi and NiYbSi.

12. The method of claim 1 wherein the composite thin film containing the dopant species is YbSiON.

* * * * *